(12) United States Patent
Terrill

(10) Patent No.: US 8,735,992 B2
(45) Date of Patent: May 27, 2014

(54) POWER SWITCH WITH ACTIVE SNUBBER

(75) Inventor: Kyle Terrill, Santa Clara, CA (US)

(73) Assignee: Vishay-Siliconix, Santa Clara, CA (US)

( * ) Notice: Subject to any disclaimer, the term of this patent is extended or adjusted under 35 U.S.C. 154(b) by 446 days.

(21) Appl. No.: 12/829,247

(22) Filed: Jul. 1, 2010

(65) Prior Publication Data

US 2011/0198704 A1      Aug. 18, 2011

Related U.S. Application Data

(60) Provisional application No. 61/305,857, filed on Feb. 18, 2010.

(51) Int. Cl.
*H01L 29/76* (2006.01)

(52) U.S. Cl.
USPC .... 257/379; 257/500; 257/536; 257/E27.014; 257/E27.016; 257/321

(58) Field of Classification Search
USPC ........... 257/379, 500, 536, E27.014, E27.016
See application file for complete search history.

(56) References Cited

U.S. PATENT DOCUMENTS

| 5,461,302 | A | 10/1995 | Garcia et al. |
| 5,945,868 | A * | 8/1999 | Robb et al. ..................... 327/482 |
| 6,545,514 | B2 * | 4/2003 | Barrow .......................... 327/110 |
| 8,063,667 | B2 * | 11/2011 | Tomita ............................ 327/58 |
| 2003/0142513 | A1 | 7/2003 | Vinciarelli |
| 2006/0072259 | A1 | 4/2006 | Yunus |
| 2009/0257255 | A1 | 10/2009 | Zhang |

* cited by examiner

*Primary Examiner* — Andy Huynh

(57) ABSTRACT

A power switch with active snubber. In accordance with a first embodiment, an electronic circuit includes a first power semiconductor device and a second power semiconductor device coupled to the first power semiconductor device. The second power semiconductor device is configured to oppose ringing of the first power semiconductor device.

21 Claims, 4 Drawing Sheets

POWER SWITCH WITH ACTIVE SNUBBER

RELATED APPLICATION

This application claims benefit of U.S. Provisional Patent Application Ser. No. 61/305,857, filed Feb. 18, 2010, entitled "Power Switch with Active Snubber" to Terrill, which is hereby incorporated herein by reference in its entirety.

FIELD OF INVENTION

Embodiments of the present invention relate to the fields of design and manufacturing of electronic circuits and semiconductors, and more particularly to systems and methods for Power Switches with Active Snubbers.

BACKGROUND

In DC-DC buck converter applications with synchronous low-side metal oxide semiconductor field effect transistors (MOSFETs), a large voltage overshoot can occur when the high-side MOSFET turns on. This overshoot may be caused by "snappy" behavior of the low-side MOSFET's body diode and can cause voltage overshoot and excessive ringing on the node connecting the drain of the low-side MOSFET to the source of the high-side MOSFET. The voltage overshoot can exceed the voltage rating of the low-side MOSFET, leading to reliability issues, e.g., reduced performance, shortened lifetime or failure. The ringing can disturb sensitive circuitry nearby, and the noise from the ringing can also cause electromagnetic interference (EMI).

FIG. 1 illustrates an exemplary DC-DC buck converter circuit 100, in accordance with the conventional art. Buck converter circuit 100 comprises a low-side MOSFET switch 110 and a high-side MOSFET switch 120. It is to be appreciated that low-side MOSFET switch 110 comprises a body diode (not shown). The MOSFET body-diode is a side effect of the fabrication process and is generally not considered to be a "good" diode. In comparison to discrete high-speed diodes, the body-diode's reverse recovery time is very long, for example, the body diode takes a long time to turn off when the current flowing through it changes direction. This may lead to a shoot through or snap back condition when the opposing switch, e.g., high-side MOSFET switch 120, is turned on.

The high-side MOSFET switch 120 and low-side MOSFET switch 110 are configured to be controlled by control circuitry, e.g., to be turned on and off, to produce an output voltage Vout. Buck converter 100 further comprises a switching node 130, for example, the coupling of the drain of the low-side MOSFET 110 to the source of the high-side MOSFET 120. In operation, switching node 130 may be subjected to ringing noise. In addition to the numerous deleterious effects described above, the ringing may approach or exceed the voltage rating of low-side MOSFET switch 110. For example, for reliability reasons, designers may desire to operate low-side MOSFET switch 110 with a peak voltage of no more than 80% of its maximum voltage rating.

Unfortunately, substitution for low-side MOSFET switch 110 with a part of a higher voltage rating is not a desirable solution. For example, MOSFETs with higher voltage ratings tend to have greater internal resistance and greater switching loss, resulting in lower switching efficiency. Thus, the conventional art does not offer a desirable solution for these problems.

SUMMARY OF THE INVENTION

Accordingly, what is needed is a power switch with an active snubber.

A power switch with an active snubber is disclosed. In accordance with a first embodiment, an electronic circuit includes a first power semiconductor device and a second power semiconductor device coupled to the first power semiconductor device. The second power semiconductor device is configured to oppose overshoot and/or ringing of the first power semiconductor device.

In accordance with another embodiment, an electronic circuit includes a high side power semiconductor switch configured to be coupled to a high voltage and configured to be controlled by a switching control logic. The electronic circuit further includes a low side power semiconductor switch configured to be coupled to a low voltage, and configured to be controlled by the switching control logic, coupled in series with the high side power semiconductor switch. The low side power semiconductor switch includes a first low side power semiconductor device and a second low side power semiconductor device coupled to the first low side power semiconductor device. The second low side power semiconductor device is configured to oppose overshoot and/or ringing of the first low side power semiconductor device.

In accordance with yet another embodiment, a MOSFET semiconductor device includes a first power semiconductor device and a second power semiconductor device coupled to the first power semiconductor device. The second power semiconductor device is configured to oppose overshoot and/or ringing of the first power semiconductor device. The first and second power semiconductor device are located on a single die.

In accordance with a still further embodiment, a trench MOSFET power semiconductor device includes a first plurality of first trenches forming a gate of a first trench MOSFET power semiconductor device and a second plurality of second trenches forming a gate of a second trench MOSFET power semiconductor device. The trench MOSFET power semiconductor device and the second trench MOSFET power semiconductor device have a common source and a common drain, and the first plurality of first trenches and the second plurality of second trenches are interwoven.

BRIEF DESCRIPTION OF THE DRAWINGS

The accompanying drawings, which are incorporated in and form a part of this specification, illustrate embodiments of the present invention and, together with the description, serve to explain the principles of the invention.

DETAILED DESCRIPTION

Reference will now be made in detail to the various embodiments of the present invention, examples of which are illustrated in the accompanying drawings. While the invention will be described in conjunction with these embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be understood that the present invention may be practiced without these specific details. In other instances, well-known methods, procedures, components, and circuits have not been described in detail so as not to unnecessarily obscure aspects of the present invention.

Figure 1:
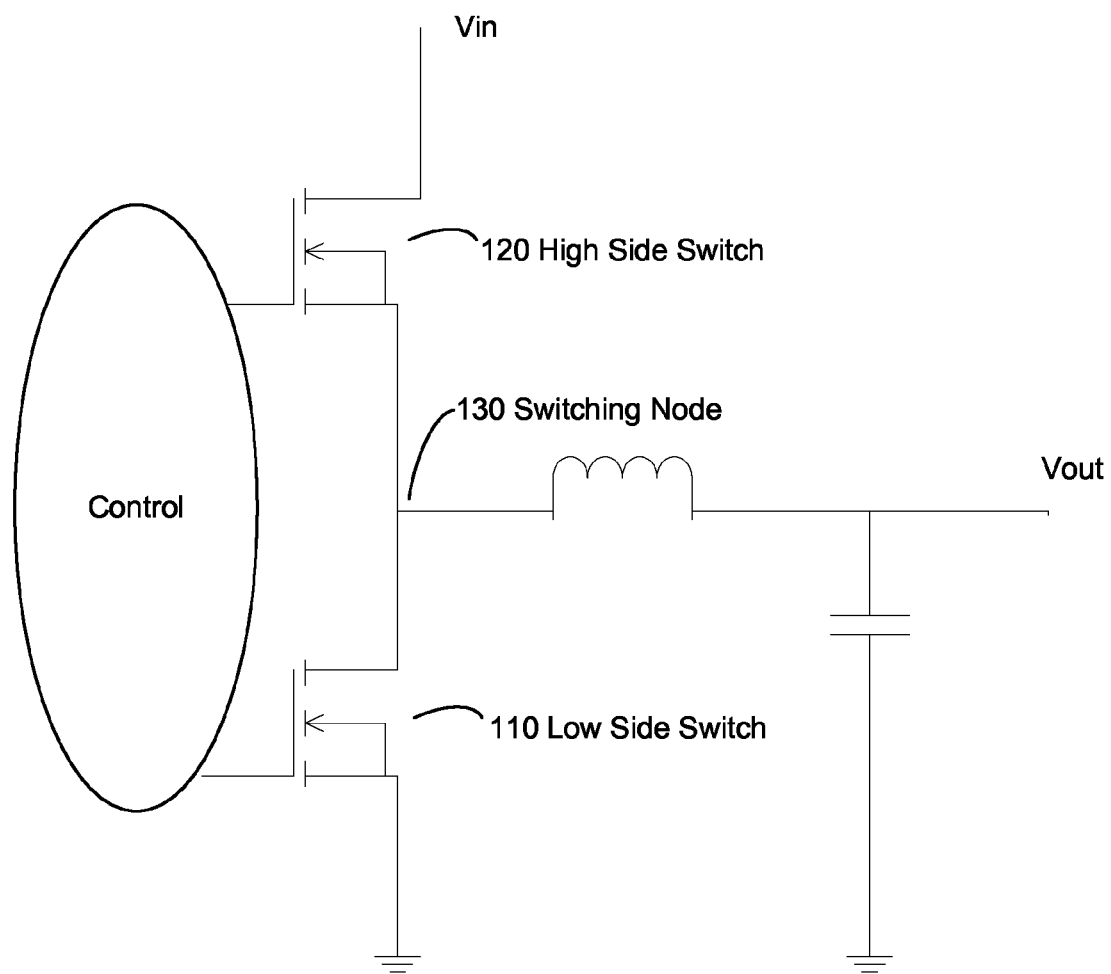
FIG. 1 illustrates an exemplary DC-DC buck converter circuit, in accordance with the conventional art.
Figure 2:
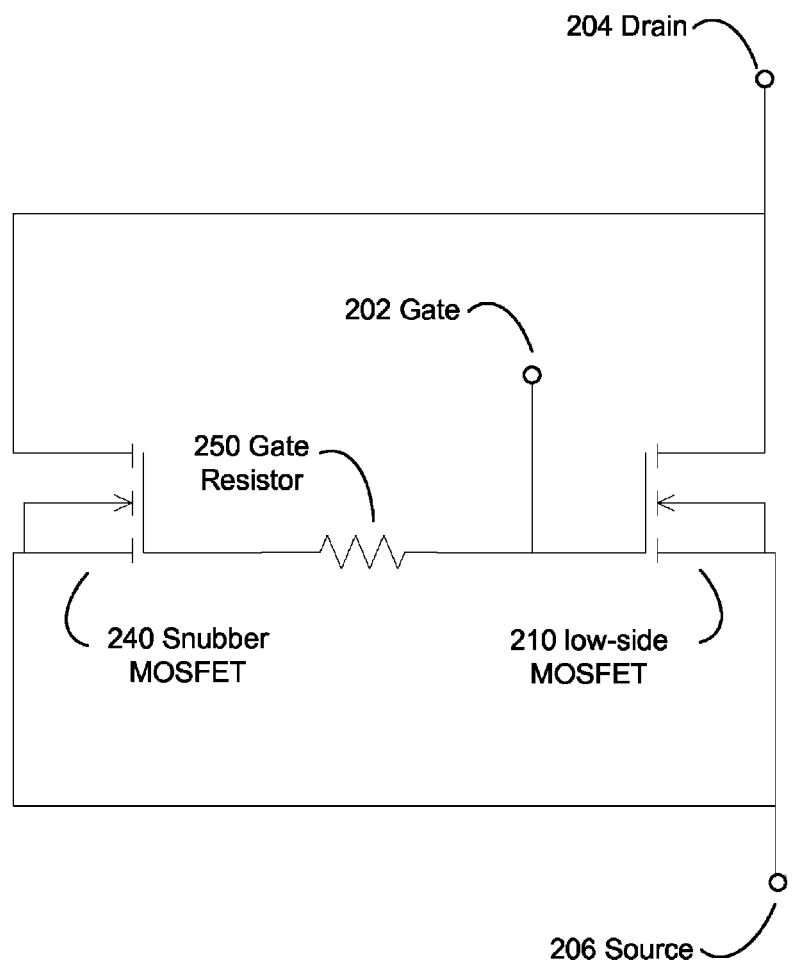
FIG. 2 illustrates an exemplary Power MOSFET with Integrated Snubber, in accordance with embodiments of the present invention.

FIG. 2 illustrates an exemplary Power MOSFET with Integrated Snubber 200, in accordance with embodiments of the present invention. MOSFET 200 may replace, for example, low-side MOSFET switch 110 (FIG. 1) in an application such as DC-DC buck converter circuit 100.

MOSFET 200 is configured externally as a single device, e.g., having one drain node 204, one source node 206 and one gate node 202. Internally, MOSFET 200 comprises two active devices, low-side MOSFET 210 and Snubber MOSFET 240. Low-side MOSFET 210 may be similar to low-side MOSFET switch 110 (FIG. 1). For example, low-side MOSFET 210 may be designed to have desirable characteristics for application in a circuit such as DC-DC buck converter circuit 100.

Snubber MOSFET 240 is coupled to low-side MOSFET 210 essentially in parallel. For example, the drain of Snubber MOSFET 240 is coupled to the drain of low-side MOSFET 210. The source of Snubber MOSFET 240 is coupled to the source of low-side MOSFET 210. The gate of Snubber MOSFET 240 is coupled to the gate of low-side MOSFET 210 through gate impedance 250.

Snubber MOSFET 240 is smaller than low side MOSFET 210, e.g., Snubber MOSFET 240 comprises less channel area than low side MOSFET 210. For example, Snubber MOSFET 240 may be 10 to 100 times smaller than low side MOSFET 210. For example, low side MOSFET 210 may comprise 95% of the channel area of power MOSFET 200, while Snubber MOSFET 240 comprises 5% of the channel area of power MOSFET 200.

Snubber MOSFET 240 and low side MOSFET 210 also differ in their respective gate-drain/gate-source charge ratios (Qgd/Qgs), which is generally reflective of the trench geometry of the respective devices. The gate charge characteristics Qgd (gate to drain charge) and Qgs (gate to source charge) are commonly specified characteristics of power semiconductors, for example, these parameters are commonly published in device data sheets. Whereas low side MOSFET 210 may have a gate-drain/gate-source charge ratio, Qgd/Qgs, of less than 1.0, Snubber MOSFET 240 should have a higher charge ratio Qgd/Qgs, e.g., a ratio in the range of about 1.5 to 4. Higher ratios may be advantageous.

Gate impedance 250 isolates Snubber MOSFET 240 from low side MOSFET 210, allowing Snubber MOSFET 240 to turn on during transients. For example, the gate impedance 250 is sufficient to enable Snubber MOSFET 240 to turn on when the gate of low side MOSFET 210 is grounded. Snubber MOSFET 240 is triggered to turn on by a high dV/dt rise time at drain node 204. The Snubber MOSFET 240 will turn on during transients if the dV/dt is much greater than Vin/(Cg× Rg) and the Qgd/Qgs is greater than 1.5, where Cg is the average gate capacitance of the Snubber MOSFET 240 and Rg is the Snubber MOSFET 240 gate impedance 250 value. In typical applications, dV/dt may be in the range of 2 volts per nanosecond to 10 volts per nanosecond.

In response to a suitably high dV/dt rise time at drain node 204, the voltage on the gate of Snubber MOSFET 240 will increase to a value greater than the threshold voltage of Snubber MOSFET 240, turning Snubber MOSFET 240 on. This effect is induced by the high Qgd/Qgs ratio of Snubber MOSFET 240. Once the gate voltage exceeds the threshold voltage of the Snubber MOSFET 240, the Snubber MOSFET 240 will turn on and generate a drain current that will act to suppress or oppose the voltage overshoot on the drain node 204. Suppression of the voltage overshoot also leads to a reduction of the power associated with the ringing noise.

By turning on in such a condition, Snubber MOSFET 240 dampens or opposes voltage overshoot and ringing, as would otherwise be present under the conventional art. In this novel manner, Snubber MOSFET 240, as a part of power MOSFET 200, advantageously reduces overshoot, ringing noise and radiated electromagnetic interference, while advantageously improving device reliability.

Figure 3:
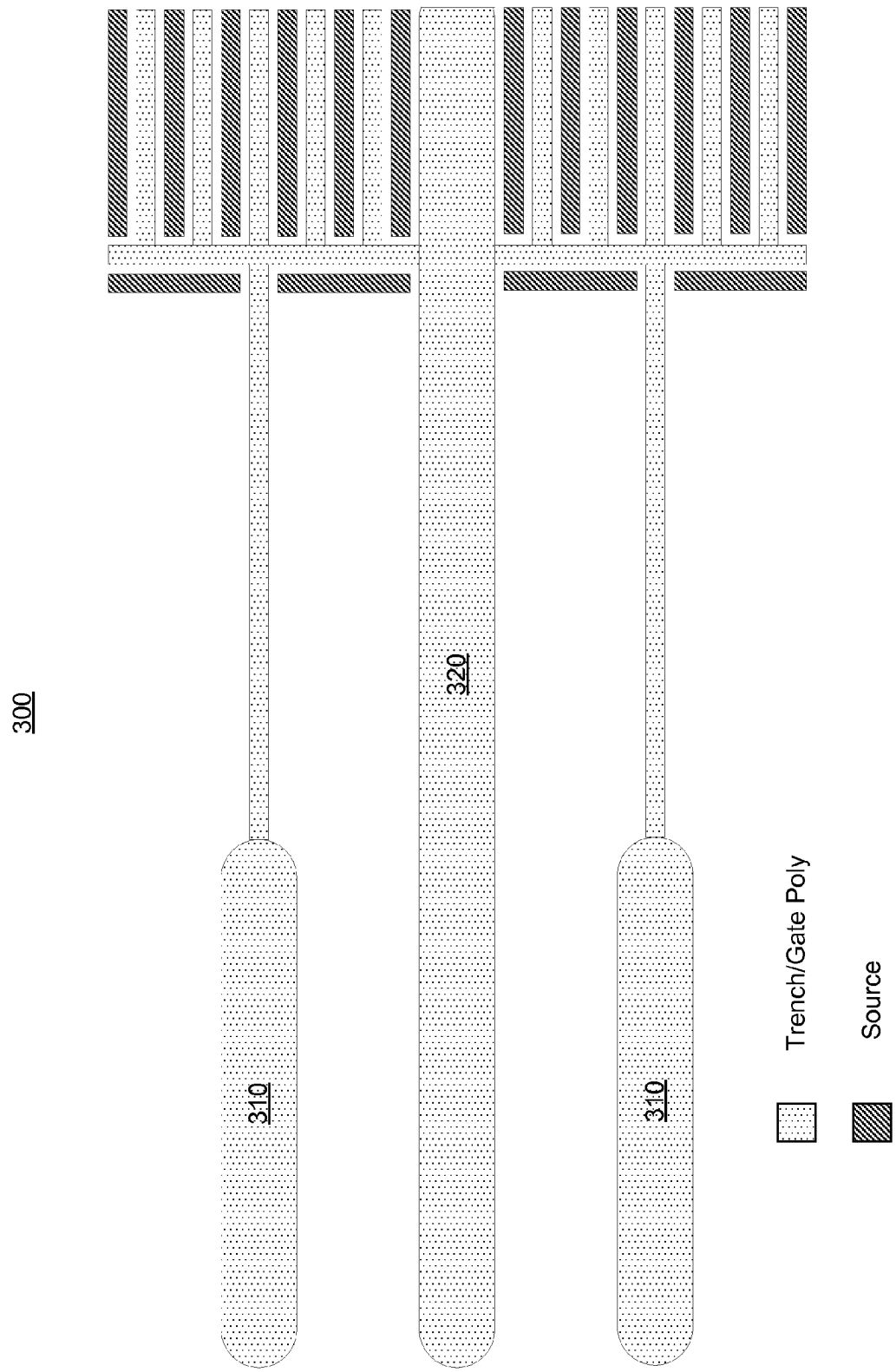
FIG. 3 illustrates a plan view of an exemplary trench layout of a portion of a power MOSFET, in accordance with embodiments of the present invention.

FIG. 3 illustrates a plan view of an exemplary trench layout 300 of a portion of power MOSFET 200, in accordance with embodiments of the present invention. It is to be appreciated that FIG. 3 is not to scale. Power MOSFETs, e.g., power MOSFET 200, generally comprise thousands of trenches. FIG. 3 illustrates gates comprising polysilicon over trenches.

Trenches 310 illustrate exemplary trenches as may be utilized in constructing a conventional power MOSFET, e.g., low-side MOSFET switch 110 of FIG. 1 or low side MOSFET 210. Within power MOSFET 200, trenches 310 may be utilized to implement low side MOSFET 210. It is to be appreciated that the trenches 310 "neck down" or are narrower for a portion of their extent. This design feature advantageously decreases the parasitic capacitances from the gate to the source and drain, e.g., Cgd and Cgs. Such narrowing also decreases the resistance of the gate.

Trench 320 illustrates an exemplary trench as may be utilized in constructing Snubber MOSFET 240 (FIG. 2). It is to be appreciated that the trench 320 may be wider than a width of trenches 310, in some embodiments. This design feature advantageously increases the ratio of Qgd to Qgs. For example, for a given trench, Qgd generally increases as the trench width increases, while Qgs does not substantially change in value. In order to achieve the desired area ratio of Snubber MOSFET 240 to low side MOSFET 210, the majority of trenches are associated with low side MOSFET 210. For example, about 1 of every 15 trenches are associated with Snubber MOSFET 240. For example, power MOSFET 200 may repeat a pattern of 14 instances of trench 310s for every one instance of trench 320. It is appreciated that charge is not uniformly distributed along a gate line/trench, and hence the ratio of trenches may not be identical to the desired ratio of effective gate areas.

Figure 4:
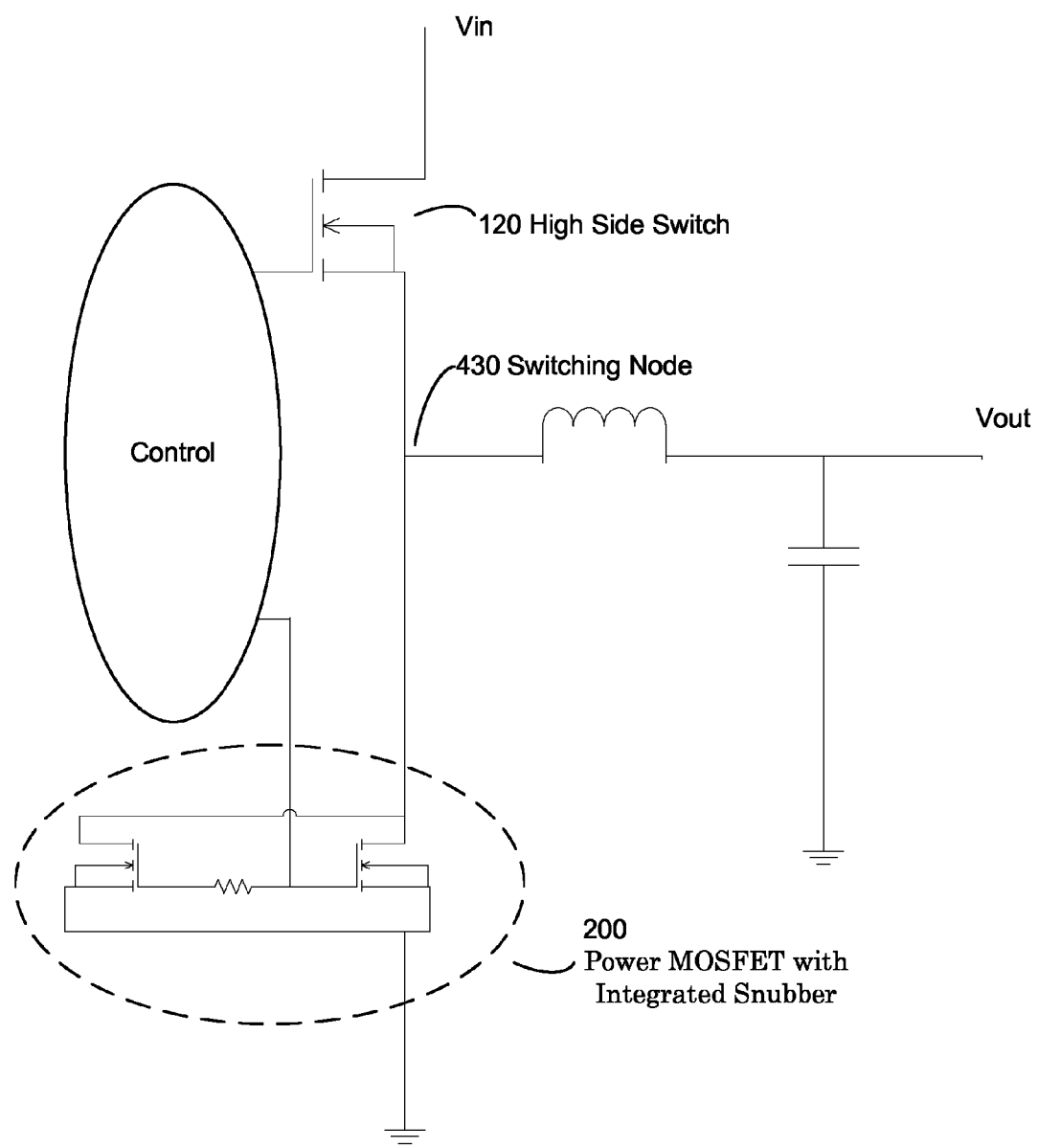
FIG. 4 illustrates an exemplary DC-DC buck converter circuit, in accordance with embodiments of the present invention.

FIG. 4 illustrates an exemplary DC-DC buck converter circuit 400, in accordance with embodiments of the present invention. Buck converter circuit 400 comprises a high-side MOSFET switch 120 and a Power MOSFET with Integrated Snubber 200, which acts a low side switch.

The high-side MOSFET switch 120 and Power MOSFET with Integrated Snubber 200 are configured to be controlled by control circuitry, e.g., to be turned on and off, to produce an output voltage Vout. Buck converter 400 further comprises a switching node 430, for example, the coupling of the drain of the Power MOSFET with Integrated Snubber 200 to the source of the high-side MOSFET 120.

In contrast to the conventional art DC-DC buck converter circuit 100 (FIG. 1), deleterious ringing noise, particularly at switching node 430, may be reduced in DC-DC buck converter 400 by operation of Snubber MOSFET 240 within Power MOSFET with Integrated Snubber 200.

It is appreciated that embodiments in accordance with the present invention are described in terms of metal oxide semiconductor field effect transistors (MOSFETs). Embodiments in accordance with the present invention are well suited to, and embodiments are envisioned in, other technologies, including the use of discrete devices, for example, embodiments in which devices 210 and 240 are separate, and semiconductors comprising other well known technologies, including bipolar, BiMOS, CMOS and other suitable technologies.

Embodiments of the present invention have been described. While the present invention has been described in particular embodiments, it should be appreciated that the present invention should not be construed as limited by such embodiments, but rather construed according to the following Claims.

What is claimed is:

1. An electronic circuit comprising:
   a first power semiconductor device; and
   a second power semiconductor device coupled to said first power semiconductor device,
   wherein said second power semiconductor device is configured to oppose ringing at a drain node of said first power semiconductor device.

2. The electronic circuit of claim 1 wherein said first and second power semiconductor devices are coupled in parallel at their respective sources and drains.

3. The electronic circuit of claim 1 wherein gates of said first and second power semiconductor devices are isolated by an impedance sufficient to enable said second power semiconductor to turn on when the gate of said first power semiconductor device is grounded.

4. The electronic circuit of claim 1 wherein said second power semiconductor device comprises less than about ten percent of the channel area as said first power semiconductor device.

5. The electronic circuit of claim 1 wherein said second power semiconductor device is characterized as having a gate-drain to gate-source charge ratio (Qgd/Qgs) of greater than about 1.5.

6. The electronic circuit of claim 1 wherein said second power semiconductor device is configured to turn on responsive to a high dV/dt rise time at its drain.

7. The electronic circuit of claim 1 wherein said second power semiconductor device is configured to turn on while said first power semiconductor device is off.

8. An electronic circuit comprising:
   a high side power semiconductor switch configured to be coupled to a high voltage and configured to be controlled by a switching control logic;
   a low side power semiconductor switch configured to be coupled to a low voltage, and configured to be controlled by said switching control logic, coupled in series with said high side power semiconductor switch;
   wherein said low side power semiconductor switch comprises:
      a first low side power semiconductor device; and
      a second low side power semiconductor device coupled to said first low side power semiconductor device,
      wherein said second low side power semiconductor device is configured to oppose ringing at a drain node of said first low side power semiconductor device.

9. The electronic circuit of claim 8 wherein said first and second low side power semiconductor devices are coupled in parallel at their respective sources and drains.

10. The electronic circuit of claim 8 wherein gates of said first and second low side power semiconductor devices are isolated by a resistance sufficient to enable said second power semiconductor to turn on when the gate of said first power semiconductor device is grounded.

11. The electronic circuit of claim 8 wherein said second low side power semiconductor device comprises less than about ten percent of the channel area as said first low side power semiconductor device.

12. The electronic circuit of claim 8 wherein said second low side power semiconductor device is characterized as having a gate-drain to gate-source charge ratio (Qgd/Qgs) of greater than about 1.5.

13. The electronic circuit of claim 8 wherein said second low side power semiconductor device is configured to turn on responsive to a high dV/dt rise time at its drain.

14. The electronic circuit of claim 8 wherein said second low side power semiconductor device is configured to turn on while said first low side power semiconductor device is off.

15. A MOSFET semiconductor device comprising:
   on a single die:
      a first power semiconductor device; and
      a second power semiconductor device coupled to said first power semiconductor device,
      wherein said second power semiconductor device is configured to oppose ringing at a drain node of said first power semiconductor device.

16. The semiconductor device of claim 15 wherein said MOSFET semiconductor device is configured to be coupled to other circuitry via one gate node, one source node and one drain node.

17. The semiconductor device of claim 15 wherein gates of said first and second power semiconductor devices are isolated by an impedance sufficient to enable said second power semiconductor to turn on when the gate of said first power semiconductor device is grounded.

18. The semiconductor device of claim 15 wherein said second power semiconductor device comprises less than about five percent of the channel area as said first power semiconductor device.

19. The semiconductor device of claim 15 wherein said second power semiconductor device is characterized as having a gate-drain to gate-source charge ratio (Qgd/Qgs) of greater than about 1.5.

20. The semiconductor device of claim 15 wherein said second power semiconductor device is configured to turn on responsive to a high dV/dt rise time at its chain.

21. The semiconductor device of claim 15 wherein said second power semiconductor device is configured to turn on while said first power semiconductor device is off.

* * * * *